(12) United States Patent
Liang

(10) Patent No.: US 6,491,046 B2
(45) Date of Patent: Dec. 10, 2002

(54) VERTICAL BATCH TYPE WAFER CLEANING APPARATUS

(75) Inventor: Ming-Chung Liang, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 97 days.

(21) Appl. No.: 09/790,593

(22) Filed: Feb. 23, 2001

(65) Prior Publication Data

US 2002/0117192 A1 Aug. 29, 2002

(51) Int. Cl.$^7$ ................................................ B08B 3/00
(52) U.S. Cl. ....................... 134/111; 134/140; 134/149; 134/153; 134/189; 134/902
(58) Field of Search ................... 134/2, 3, 10, 25.4, 134/33, 34, 111, 140, 147, 149, 153, 157, 189, 902

(56) References Cited

U.S. PATENT DOCUMENTS

| | | |
|---|---|---|
| 3,488,713 A | 1/1970 | Hoornstra et al. ............. 156/14 |
| 5,520,205 A | 5/1996 | Guldi et al. ............. 134/102.1 |
| 6,235,147 B1 | 5/2001 | Lee et al. ..................... 134/1.3 |
| 6,365,064 B1 | 4/2002 | Tsai et al. ..................... 134/15 |

FOREIGN PATENT DOCUMENTS

JP  2001237302 A  8/2001

Primary Examiner—Randy Gulakowski
Assistant Examiner—Joseph Perrin
(74) Attorney, Agent, or Firm—Rosenberg, Klein & Lee

(57) ABSTRACT

The present invention provides a vertical batch type wafer cleaning apparatus comprising a wafer bearing apparatus in a cleaning tank. The wafer bearing apparatus comprises three parallel upstanding racks and a plurality of wafer shelves arranged up and down between the three racks. Three deflections are uniformly formed at edge of each of the wafer shelves. The three racks have two cover bodies at two ends thereof to connect two rotators. The wafer bearing apparatus is driven to rotate by synchronous rotation of the two rotators. A flow distributor is provided in the cleaning tank to connect an output pipe of the cleaning solution supply tank so that cleaning solution can be distributed and transferred to between the wafer shelves. Two filter pipes are provided between the cleaning tank and the cleaning solution supply tank to let cleaning solution be used in recirculating way. The present invention has advantages of enhanced cleaning efficiency and reduced cost.

5 Claims, 3 Drawing Sheets

VERTICAL BATCH TYPE WAFER CLEANING APPARATUS

FIELD OF THE INVENTION

The present invention relates to a wafer cleaning apparatus and, more particularly, to a vertical batch type wafer cleaning apparatus, which can effectively increase wafer cleaning efficiency.

BACKGROUND OF THE INVENTION

In the fabrication process of large-scale integrated circuits, wafer cleaning technique and cleanliness are important factors affecting yield and device quality. The object of wafer cleaning is to remove contaminants from surfaces of wafers and to remove particles and organic and inorganic impurities. Therefore, before silicon wafers enter a high-temperature oven for performing a thermal process such as diffusion or oxidation, and before or after chemical vapor deposition is performed, wafers must undergo a cleaning process to let fabricated semiconductor electronic devices conform to designed electrical characteristics.

In the prior art, a plurality of wafers are placed on a boat and dipped into a cleaning tank along with the boat so that the wafers can be cleaned using flow of injected chemical cleaning solution. However, in this cleaning method, flow of cleaning solution will be restricted between wafers so that cleaning solution and surfaces of the wafers cannot effectively interact, letting wafer cleaning effect be bad. In the prior art, a rocking or shaking means is exploited to enhance flow of cleaning solution, but the wafer cleaning effect is still not good enough. Moreover, breakage of wafers may occur because of too large rocking or shaking force. In consideration of the above problems, the present invention aims to propose a wafer cleaning apparatus, which can enhance wafer cleaning efficiency.

SUMMARY OF THE INVENTION

The primary object of the present invention is to provide a vertical batch type wafer cleaning apparatus, which can effectively increase velocity of cleaning solution flowing by surfaces of wafers to enhance wafer cleaning efficiency.

Another object of the present invention is to propose a vertical batch type wafer cleaning apparatus to let there be flow of cleaning solution between every two wafers so that each wafer can be cleaned by the cleaning solution. Still another object of the present invention is to propose a vertical batch type wafer cleaning apparatus, in which cleaning solution can be used in recirculating way, thereby reducing the cost.

According to the present invention, a wafer bearing apparatus and a flow distributor are provided in a cleaning tank. The wafer bearing apparatus is formed by arranging a plurality of wafer shelves up and down between three parallel upstanding racks. Three deflections are uniformly formed at the edge of each of the wafer shelves. The three racks have two cover bodies at two ends thereof to connect two rotators, respectively. The flow distributor is connected to a cleaning solution supply tank via an output pipe so that cleaning solution can be distributed and transferred to between the wafer shelves. Two filter pipes are further provided between the cleaning tank and the cleaning solution supply tank.

The various objects and advantages of the present invention will be more readily understood from the following detailed description when read in conjunction with the appended drawings, in which:

DETAILED DESCRIPTION OF THE PREFERRED EMBODIMENTS

Figure 1:
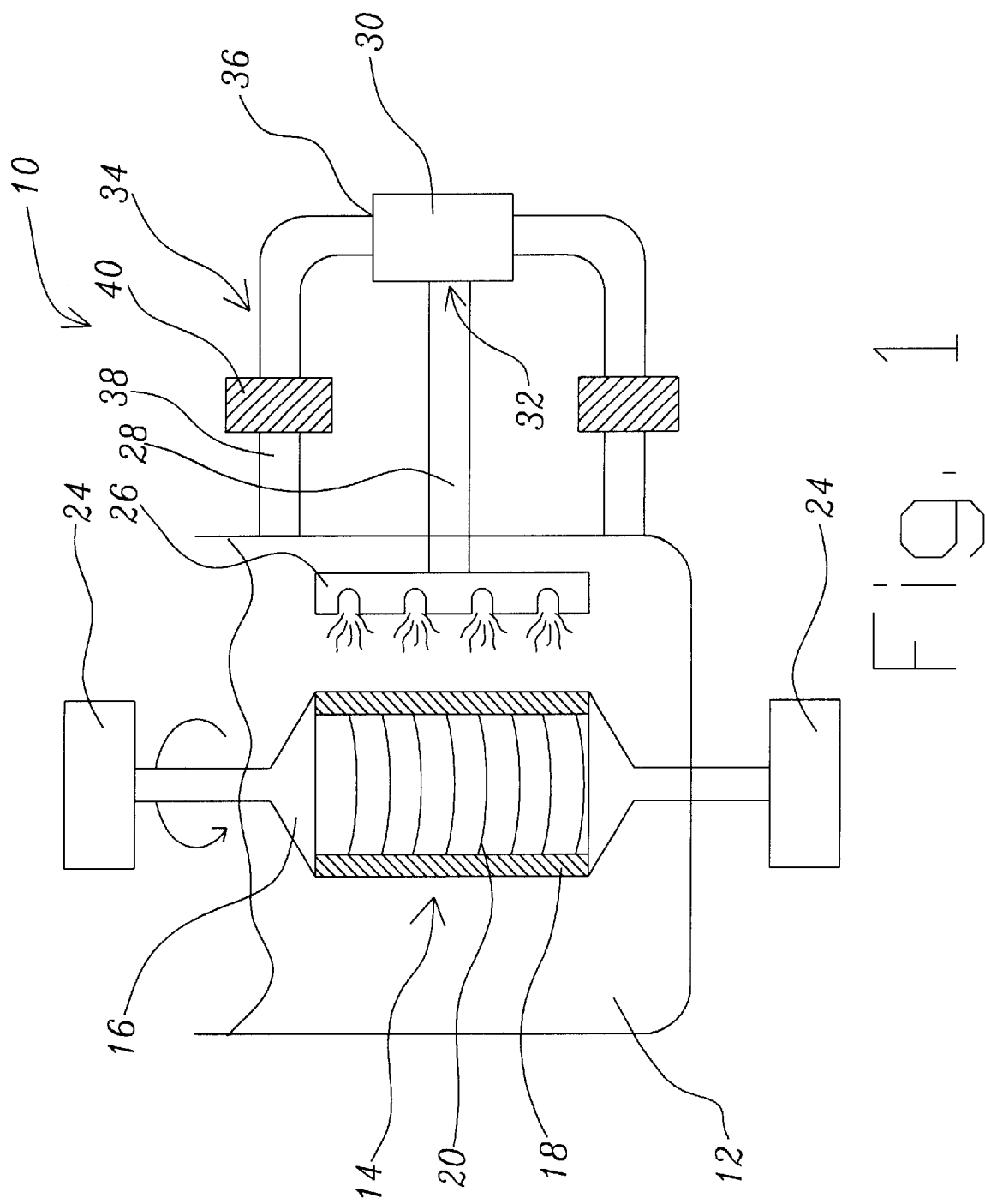
FIG. 1 is a diagram of a cleaning apparatus of the present invention.
Figure 2:
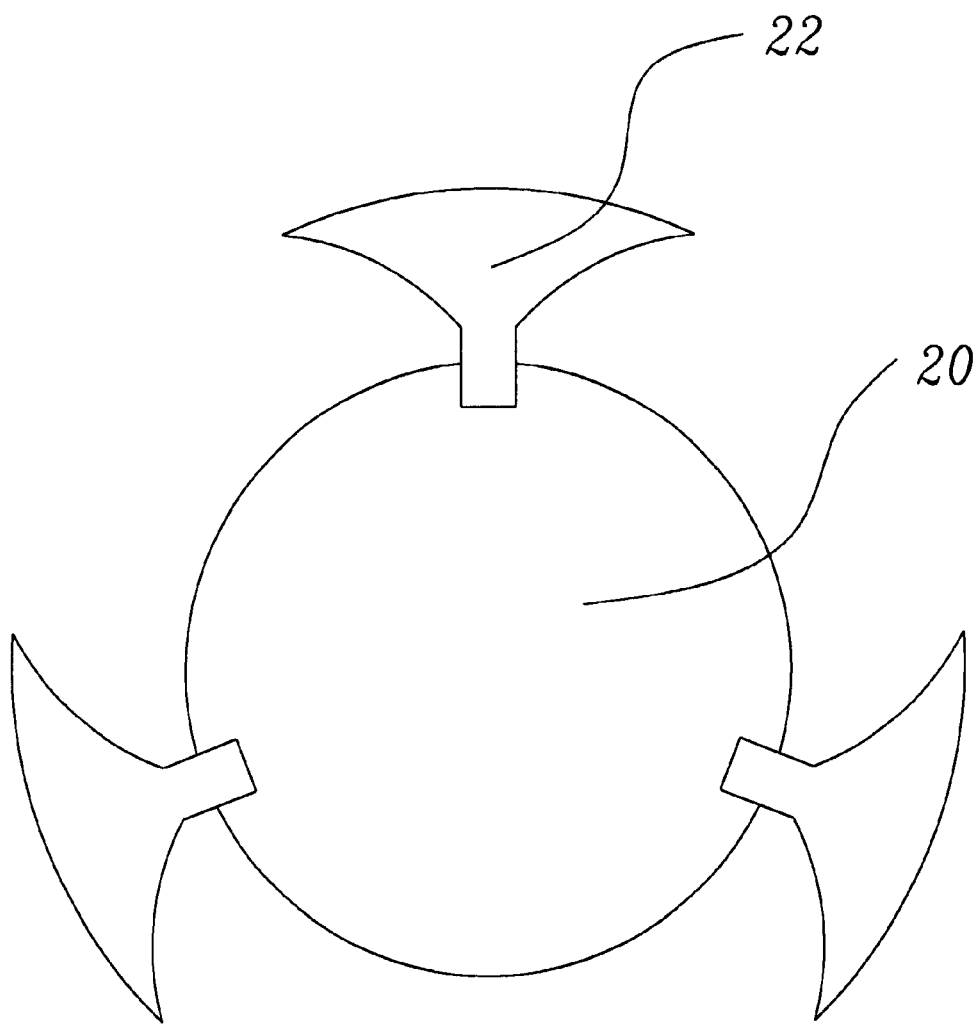
FIG. 2 is a top side view of a wafer shelf of the present invention.
Figure 3:
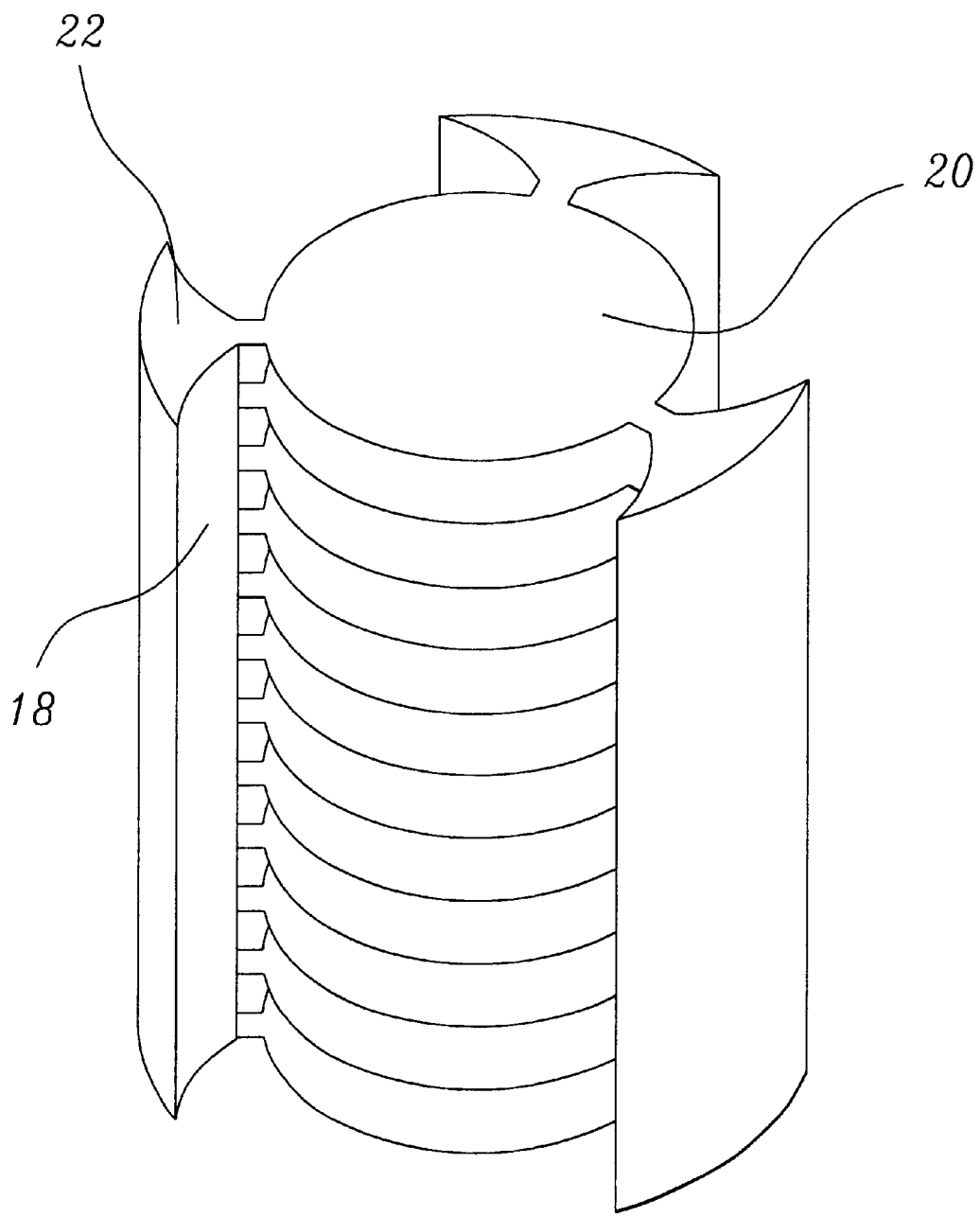
FIG. 3 is a perspective view of wafer shelves of the present invention.

FIG. 1 shows a vertical batch type wafer cleaning apparatus 10, wherein a flow distributor 26 is provided in a cleaning tank 12. The flow distributor 26 is connected to an outlet 32 of a cleaning solution supply tank 30 via an output pipe 28 so that cleaning solution in the cleaning solution supply tank 30 is diffluent when transferred to the cleaning tank 12. A wafer bearing apparatus 14 is provided in the cleaning tank 12. The wafer bearing apparatus 14 comprises two spaced cover bodies 16. Three parallel upstanding racks 18 are uniformly arranged at the edges of two opposed surfaces of the two cover bodies 16 to connect the two cover bodies. A plurality of wafer shelves 20 are horizontally arranged up and down between the two cover bodies 16. Three deflections 22 are uniformly formed at the edge of each of the wafer shelves 20, as shown in FIG. 2. The deflection 22 is an etch-resistant sheet. The positions of the three deflections 22 correspond to those of the three racks 18 so that each of the wafer shelves 20 can be fastened on the three racks 18 by means of the three deflections 22, as shown in FIG. 3. The arrangement of the plurality of wafer shelves 20 lets wafers be placed thereon and cleaned in batch way. Two rotators 24 are respectively connected to two ends of the wafer bearing apparatus 14 to drive the whole wafer bearing apparatus 14 to rotate horizontally. Two filter pipe 34 are respectively connected to the upper and lower ends of a side face of the cleaning tank 12 to connect two injection mouths 36 of the cleaning solution supply tank 30. Thereby, used cleaning solution can be filtered by the filter pipe 34 ad then flow into the cleaning solution supply tank 30 to be outputted for use again.

In the present invention, a plurality of wafers are placed on the wafer shelves 20 of the wafer bearing apparatus 14. All the wafer shelves 20 along with the wafers are driven to rotate coaxially by the synchronous rotation of the two rotators 24. At this time, cleaning. solution outputted from the cleaning solution supply tank 30 will flow through the flow distributor 26 and are distributed and transferred to between the wafers. The deflections 22 provided on the wafer shelves 20 will lead compulsively convective cleaning solution to between the wafers to effectively increase the velocity of cleaning solution flowing by the surfaces of the wafers, thereby enhancing mixing and chemical interaction between cleaning solution and the wafers. Therefore, the present invention can enhance wafer cleaning efficiency of cleaning solution.

The above filter pipe 34 is formed by providing a filter 40 in a pipe 38. Because light particles and heavy particles in the cleaning solution will drift toward the upper part and the lower part of the cleaning tank 12 during the cleaning process, the filter 40 in the filter pipe 34 provided at the upper end of a side face of the cleaning tank 12 is used mainly for filtering light particles, while the filter 40 in the filter pipe 34 provided at the lower end of a side face of the cleaning tank 12 is used mainly for filtering heavy particles. This kind of design can let cleaning solution be used in recirculating way, thereby reducing the cost.

The above rotators 24 can be set to rotate at specific speeds or periodically variable speeds.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A vertical batch type wafer cleaning apparatus comprising:
   a cleaning solution supply tank having at least an outlet and at least an injection mouth;
   a cleaning tank having a flow distributor therein, said flow distributor being connected to said outlet to let cleaning solution outputted from said outlet be diffluent in said cleaning tank, said cleaning tank being connected to said injection mouth via at least a filter pipe;
   a wafer bearing apparatus provided in said cleaning tank, said wafer bearing apparatus comprising at least three parallel upstanding racks and a plurality of wafer shelves horizontally arranged up and down between said three racks, each of said wafer shelves having a plurality of deflections uniformly formed at edge thereof; and
   two rotators respectively connected to two ends of said three racks of said wafer bearing apparatus, said wafer bearing apparatus being driven to rotate horizontally by means of synchronous rotation of said two rotators.

2. The vertical batch type wafer cleaning apparatus as claimed in claim 1, wherein each of said wafer shelves can be horizontally fastened on said three racks by means of said deflections to let said plurality of wafer shelves be disposed between said three racks.

3. The vertical batch type wafer cleaning apparatus as claimed in claim 1, wherein said three racks of said wafer bearing apparatus can further have two cover bodies at two ends thereof, respectively, and said three racks are connected to said two rotators through said two cover bodies.

4. The vertical batch type wafer cleaning apparatus as claimed in claim 1, wherein rotation of said rotators can be rotation of specific speeds or rotation of periodically variable speeds.

5. The vertical batch type wafer cleaning apparatus as claimed in claim 1, wherein said deflection can be an etch-resistant sheet.

* * * * *